(12) United States Patent
Chang (10) Patent No.: US 7,935,992 B2
(45) Date of Patent: May 3, 2011

(54) TRANSISTOR, DISPLAY DRIVER INTEGRATED CIRCUIT INCLUDING A TRANSISTOR, AND A METHOD OF FABRICATING A TRANSISTOR

(75) Inventor: Hoon Chang, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 246 days.

(21) Appl. No.: 12/292,375

(22) Filed: Nov. 18, 2008

(65) Prior Publication Data

US 2009/0140334 A1    Jun. 4, 2009

(30) Foreign Application Priority Data

Dec. 3, 2007    (KR) .................. 10-2007-0124370

(51) Int. Cl.
*H01L 29/00* (2006.01)
(52) U.S. Cl. ........................ 257/288; 257/369
(58) Field of Classification Search .................. 257/288, 257/314, 369
See application file for complete search history.

(56) References Cited

U.S. PATENT DOCUMENTS

2006/0289905 A1 * 12/2006 Kito et al. .................... 257/288

FOREIGN PATENT DOCUMENTS

| JP | 2001-196546 | 7/2001 |
|---|---|---|
| KR | 10-0302611 | 7/2001 |
| KR | 10-2006-0104023 | 10/2006 |
| KR | 10-0734302 | 6/2007 |

OTHER PUBLICATIONS

Abstract of KR 10-2001-0001608 published Jan. 5, 2001.

* cited by examiner

*Primary Examiner* — Thomas L Dickey
(74) *Attorney, Agent, or Firm* — Harness, Dickey & Pierce, P.L.C.

(57) ABSTRACT

A transistor, a display driver integrated circuit having the transistor, and a method for fabricating a transistor are provided. A transistor, according to example embodiments, may include a substrate with a device active region defined by an isolation layer, wherein the device active region may include a source active region, a channel active region, and a drain active region and the channel active region may include a pair of edges contacting the isolation layer. The transistor, according to example embodiments, may also include a gate electrode overlapping the channel active region, wherein the edges are exposed beyond a periphery of the gate electrode, a gate dielectric between the gate electrode and the channel active region, and source and drain impurity regions within the source and drain active regions.

20 Claims, 9 Drawing Sheets

TRANSISTOR, DISPLAY DRIVER INTEGRATED CIRCUIT INCLUDING A TRANSISTOR, AND A METHOD OF FABRICATING A TRANSISTOR

PRIORITY STATEMENT

This application claims priority under 35 U.S.C. §119 to Korean Patent Application No. 10-2007-0124370, filed on Dec. 3, 2007, in the Korean Intellectual Property Office (KIPO), the entire contents of which are herein incorporated by reference.

BACKGROUND

1. Field

Example embodiments relate to a semiconductor device and, more particularly, to a transistor that operates at an increased voltage. Example embodiments also relate to a method of fabricating the transistor.

2. Description of the Related Art

Display driver integrated circuits (DDI) have been developed for driving flat display devices, e.g., liquid crystal display devices LCDs and plasma display panels PDPs. The DDI may include a high-voltage transistor and a normal transistor. The high-voltage transistor may be driven by a voltage of about 8-200V and the normal transistor may be driven by a voltage of about 5V or less.

A well-doping concentration of the high-voltage transistor may be lower than that of the normal transistor to increase a junction breakdown voltage. The well-doping concentration on a boundary surface between an active region and an isolation region may be lowered due to dopant segregation. Channels may be formed in the boundary surface between the active region and the isolation layer by a voltage lower than a voltage by which channels are formed in a central region of the active region. As a result, a high-voltage transistor may appear to have two threshold voltages (a hump phenomenon).

SUMMARY

Example embodiments provide a transistor that does not experience a hump phenomenon and a display driver integrated circuit (DDI) having the transistor. Example embodiments also provide for a method of fabricating a transistor.

A transistor, according to example embodiments, may include a substrate with a device active region defined by an isolation layer, wherein the device active region may include a source active region, a channel active region, and a drain active region. The channel active region may include a pair of edges contacting the isolation layer. The transistor, according to example embodiments, may also include a gate electrode overlapping the channel active region, wherein the edges are exposed beyond a periphery of the gate electrode, a gate dielectric between the gate electrode and the channel active region, and source and drain impurity regions within the source and drain active regions.

A method of fabricating a transistor, according to example embodiments, may include forming a well of a first conductivity type in a substrate and forming a device isolation layer in the substrate wherein the device isolation layer defines a device active region. A method of fabricating a transistor, according to example embodiments, may also include forming source drift region and a drain drift region in the device active region, wherein the source and drain drift regions may have a second conductivity type and the source drift region and the drain drift region may be separated by a channel active region with a pair of edges contacting the device isolation layer. A method of fabricating a transistor, according to example embodiments may also include forming source and drain impurity regions within the source drift region and the drain drift regions. A method of fabricating a transistor, according to example embodiments may also include forming a drain field dielectric in the active region, a gate dielectric on the substrate, and a gate electrode on the gate dielectric overlapping the channel active region, wherein the edges may be exposed beyond a periphery of the gate electrode. A method of fabricating a transistor, according to example embodiments may also include forming an interlayer dielectric layer over the substrate, forming a source contact hole, a gate contact hole, and a drain contact hole in the interlayer dielectric layer and forming a source drain line, a gate line, and a drain line in the source contact hole, the gate contact hole, and the drain contact hole.

BRIEF DESCRIPTION OF THE DRAWINGS

Example embodiments will be more clearly understood from the following detailed description taken in conjunction with the accompanying drawings. FIGS. 1-9 represent non-limiting, example embodiments as described herein.

DETAILED DESCRIPTION OF EXAMPLE EMBODIMENTS

Example embodiments will now be described more fully with reference to the accompanying drawings, in which example embodiments are shown. Example embodiments may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the sizes of components may be exaggerated for clarity.

It will be understood that when an element or layer is referred to as being "on", "connected to", or "coupled to" another element or layer, it can be directly on, connected to, or coupled to the other element or layer or intervening elements or layers that may be present. In contrast, when an element is referred to as being "directly on", "directly connected to", or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. Thus, a first element, component, region, layer, or section discussed below could be termed a second element, component, region, layer, or section without departing from the teachings of example embodiments.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments described herein will refer to plan views and/or cross-sectional views by way of ideal schematic views. Accordingly, the views may be modified depending on manufacturing technologies and/or tolerances. Therefore, example embodiments are not limited to those shown in the views, but include modifications in configuration formed on the basis of manufacturing processes. Therefore, regions exemplified in figures have schematic properties and shapes of regions shown in figures exemplify specific shapes or regions of elements, and do not limit example embodiments.

Figure 1:
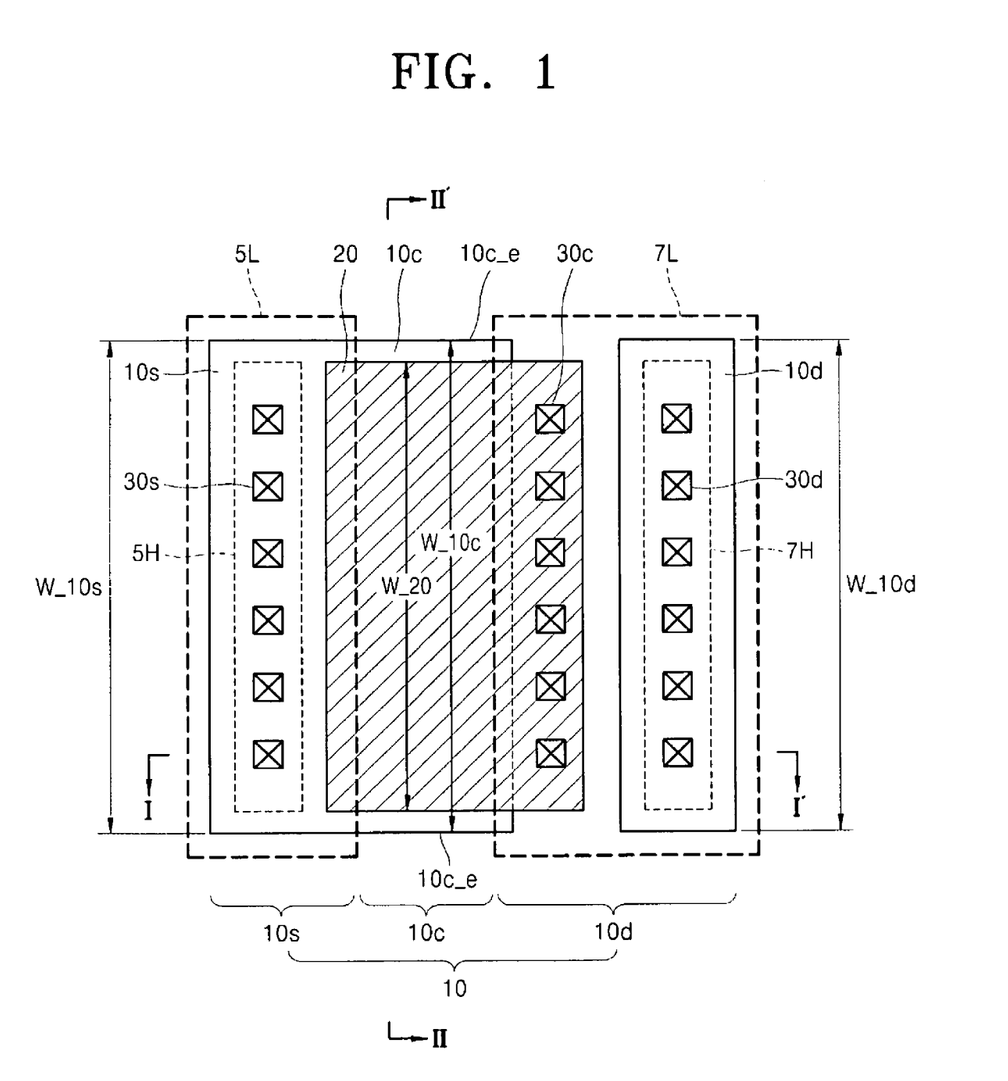
FIG. 1 is a schematic plan view of a high-voltage transistor according to example embodiments.
Figure 2A:
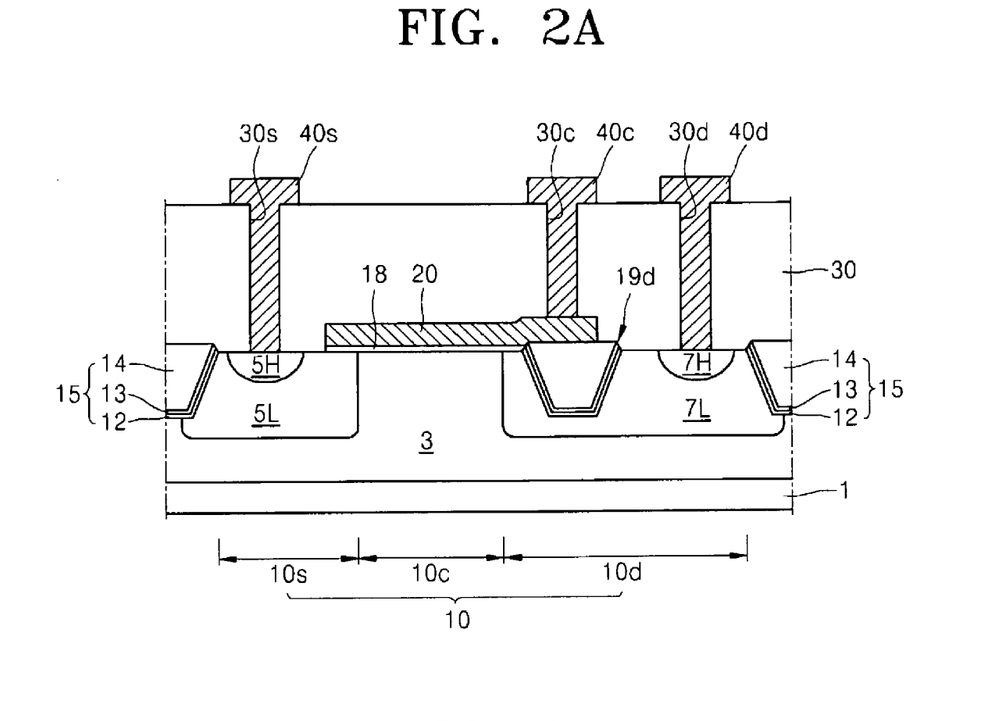
FIG. 2A is a cross-sectional view taken along line I-I' of FIG. 1.
Figure 2B:
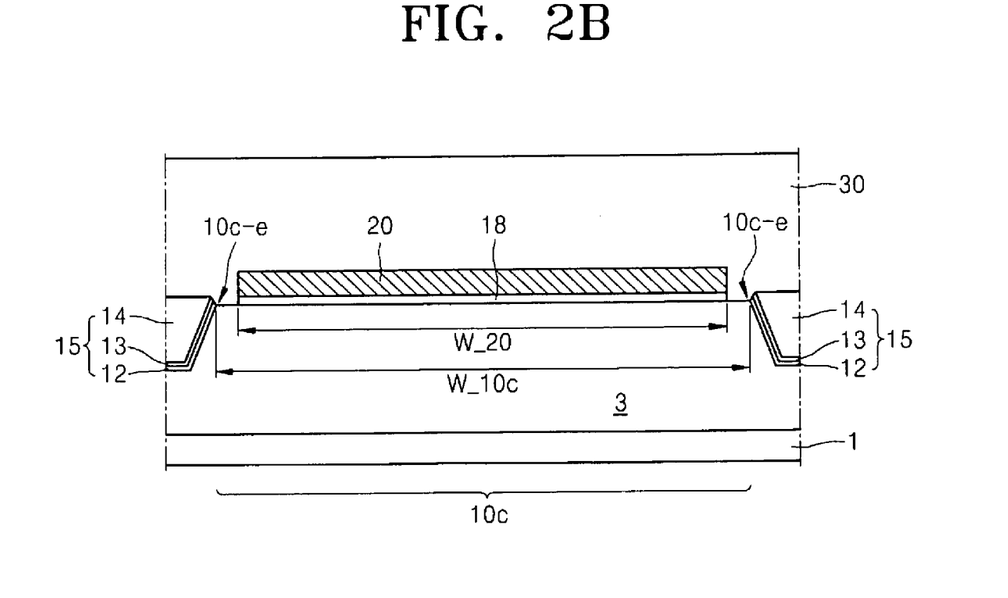
FIG. 2B is a cross-sectional view taken along line II-II' of FIG. 1.

FIG. 1 is a schematic plan view of a high-voltage transistor according to example embodiments, FIG. 2A is a cross-sectional view taken along line I-I' of FIG. 1, and FIG. 2B is a cross-sectional view taken along line II-II' of FIG. 1. Referring to FIGS. 1, 2A, and 2B, a device active region 10 may be defined by an isolation layer 15 formed in a substrate 1. A well 3 may be formed in the substrate 1. The well 3 may be a first conductivity type, e.g., an n-type or a p-type.

The well 3 may have a relatively low doping concentration compared with a typical transistor. Therefore, a junction breakdown voltage at an impurity region in the well 3 may be increased. The well 3 may be formed by boron, a p-type dopant. A proper dose of the boron may be about $5\times10^{11}$~$5\times10^{13}$ ions/cm$^2$. For example, the proper dose of the boron may be about $2\times10^{13}$ ions/cm$^2$. However, the well-doping concentration may be lowered at a boundary portion between the device active region 10 and the isolation layer 15 due to dopant segregation.

The device active region 10 may include a source active region 10s, a channel active region 10c, and a drain active region 10d. The channel active region 10c may include a pair of edges 10c_e contacting the isolation layer 15 and facing each other. A drain drift region 7L may be formed in the drain active region 10d. The drain drift region 7L may extend to a lower portion of the isolation layer 15 adjacent to the drain active region 10d. A drain impurity region 7H may have a higher impurity concentration than the drain drift region 7L and may be formed in the drain drift region 7L. The drain drift region 7L may enclose the drain impurity region 7H, and may function as a buffer region to increase the junction breakdown voltage.

A source drift region 5L may be formed in the source active region 10s. The source drift region 5L may extend to a lower portion of the isolation layer 15 adjacent to the source active region 10s. A source impurity region 5H may have a higher impurity concentration than the source drift region 5L and may be formed in the source drift region 5L. The source drift region 5L may enclose the source impurity region 5H. The source drift region 5L may increase the junction breakdown voltage. Example embodiments are not limited to this configuration. For example, the source drift region 5L may be omitted.

The source and drain impurity regions 5H and 7H and the source and drain drift regions 5L and 7L may be a second conductivity type. For example, the first conductivity type may be an n-type and the second conductivity type may be a p-type. In the alternative, the first conductivity type may be a p-type and the second conductivity type may be an n-type. The source and drain impurity regions 5H and 7H and the source and drain drift regions 5L and 7L may be formed by doping phosphorous (P), an n-type dopant. A proper dose of the phosphorous (P) for forming the source and drain drift regions 5L and 7L may be about $5\times10^{11}$~$5\times10^{13}$ ions/cm$^2$. For example, the proper dose of the phosphorous may be $8\times10^{12}$ ions/cm$^2$. A proper dose of the phosphorus forming the source and drain impurity regions 5H and 7H may be about $1\times10^{15}$ 18 $2\times10^{16}$ ions/cm$^2$.

The channel active region 10c may be defined as an active region between the source drift region 5L and the drain drift region 7L. If the source drift region 5L is omitted, the channel active region 10c may be defined as an active region between the source impurity region 5H and the drain drift region 7L. A length of the channel active region 10c may be defined as a distance between the source drift region 5L (or the source impurity region 5H) and the drain drift region 7L in a direction parallel with a channel length direction of the transistor. A width W_10c of the channel active region 10c may be defined as a distance between the edges 10c_e of the channel active region 10c in a direction parallel with a channel width direction of the transistor. The width w_10c of the channel active region may be substantially the same as a width W_10s of the source active region 10s and a width W_10d of the drain active region 10d.

A gate electrode 20 may overlap the channel active region 10c and may be disposed on the active region 10. A gate dielectric 18 may be disposed between the channel active region 10c and the gate electrode 20. The gate electrode 20 may extend to the drain active region 10d. For example, the gate electrode 20 may extend onto the drain drift region 7L. A drain field dielectric 19d may be thicker than the gate dielectric 18 and may be located between the gate electrode 20 and the drain drift region 7L. In example embodiments, an electric field between the gate electrode 20 and the drain drift region 7L may be reduced, and thus, a breakdown voltage between the gate electrode 20 and the drain drift region 7L may be increased. The drain field dielectric 19d may have the same structure as the isolation layer 15. For example, each of the drain field dielectric 19d and the isolation layer 15 may have a shallow trench isolation (STI) structure. On the other hand, the drain field dielectric 19d may have a different structure than the isolation layer 15. For example, the isolation layer 15 may have a STI structure while the drain field dielectric 19d may have a local oxidation of silicon (LOCOS) structure.

A width W_20 of the gate electrode 20 may be less than the width W_10c of the channel active region 10c. Therefore, the edges 10c_e of the channel active region 10c may be exposed around the gate electrode 20. If the gate electrode 20 is located on the edges 10c_e of the channel active region 10c, the edges 10c_e may have a relatively lower well-doping concentration as compared with other portions due to dopant segregation. Therefore, the edges 10c_e may be easily inversed even when a voltage lower than a threshold voltage is applied to the gate electrode 20. As a result, a channel, e.g., a current path, may be formed in the edges 10c_e at a voltage lower than the threshold voltage, and thus, a hump may be induced in an Id-Vg curve. However, in example embodiments, because the gate electrode 20 is not formed on the edges 10c_e of the channel active region 10c, the edges 10c_e may not be affected by the voltage that is applied to the gate electrode 20. Therefore, channels may be prevented or reduced from being formed in the edges 10c_e, and thus, the hump may not be induced in the Id-Vg curve. As a result, a sub-threshold leakage current equal to or less than the threshold voltage may be reduced or prevented. A distance between the gate electrode 20 and the edges 10c_c of the channel active region 10c may be about 0.0-1 µm.

The isolation layer 15 may have the STI structure including an oxide layer liner 12, a nitride layer liner 13, and a buried dielectric 14. The nitride layer liner 13 may deteriorate a transistor property by trapping electric charges traveling along a channel during a transistor operation. However, because channels may not be formed in the edges 10c_e, as described above, the trapping of the electric charges in the nitride layer liner 13 of the isolation layer 15 adjacent to the edges 10c_e may be prevented or reduced. Therefore, the deterioration of the high-voltage transistor may be prevented or reduced.

An interlayer dielectric 30 covering the gate electrode 20 may be provided on the substrate 1. The interlayer dielectric 30 may be provided with a gate contact hole 30c for partly exposing the gate electrode 20, a source contact hole 30s for partly exposing the source impurity region 5H, and a drain contact hole 30d for partly exposing the drain impurity region 7H. The gate contact hole 30c may overlap the drain field dielectric 19d. The drain field dielectric 19d may be thicker than the gate electrode 18, and thus, the drain field dielectric 19d may not experience dielectric breakdown during a process for forming the gate contact hole 30c.

Gate, source, and drain lines 40c, 40s, and 40d may be disposed in the interlayer dielectric 30. The gate line 40c may be electrically connected to the gate electrode 20 through the gate contact hole 30c, and the source line 40s may be electrically connected to the source impurity region 5H through the source contact hole 30s. In addition, the drain line 40d may be electrically connected to the drain impurity region 7H through the drain contact hole 30d.

Figure 3A:
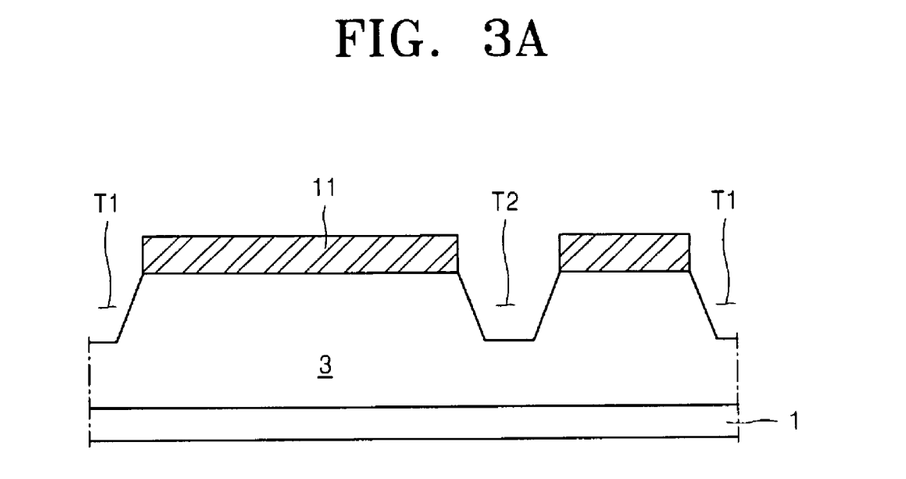
FIGS. 3A, 3B, and 3C are cross-sectional views illustrating a method of manufacturing the high-voltage transistor according to example embodiments, the views being taken along line I-I' for respective processes.
Figure 3B:
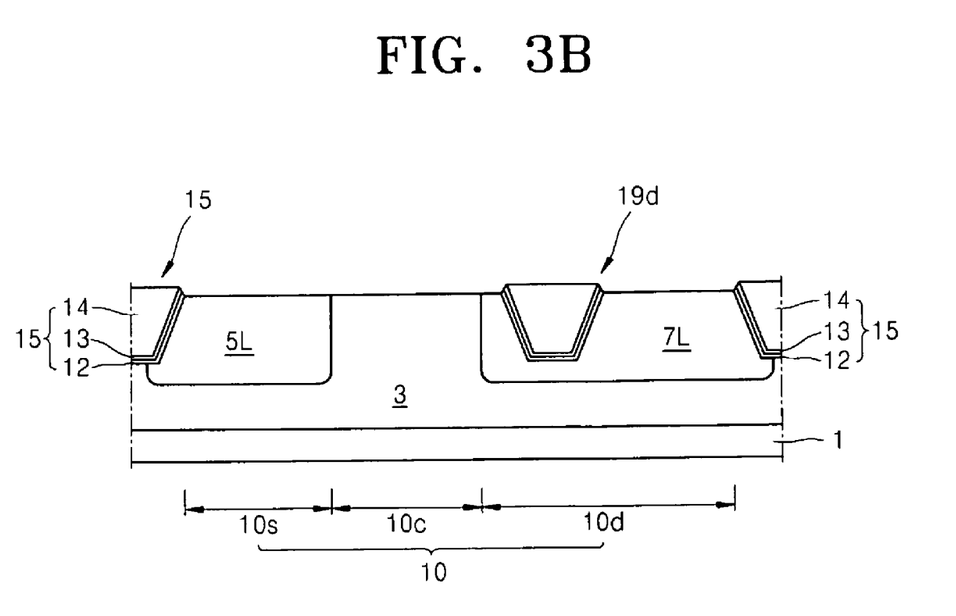
Figure 3C:
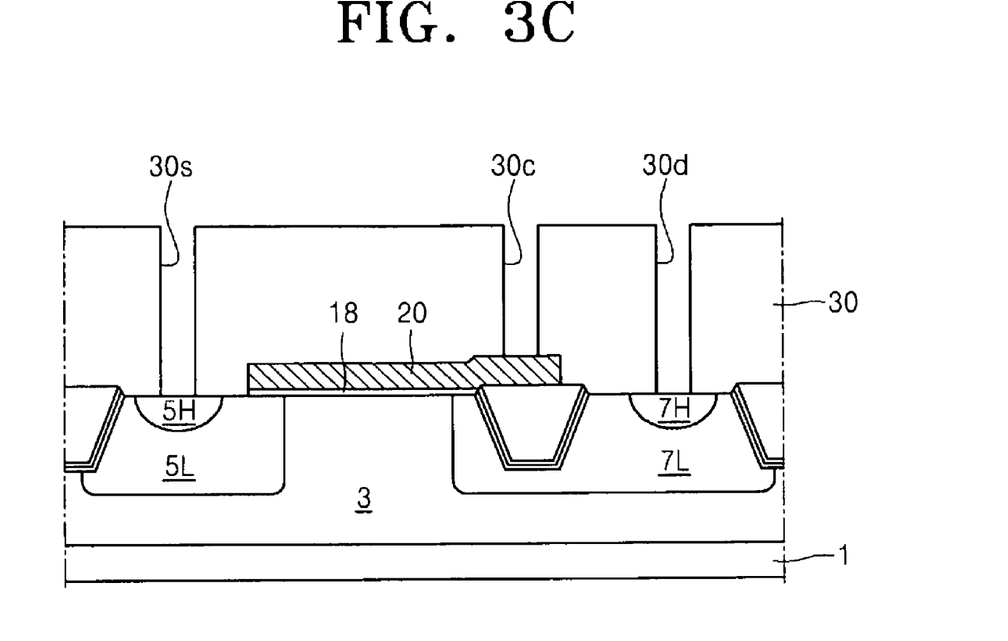
Figure 4A:
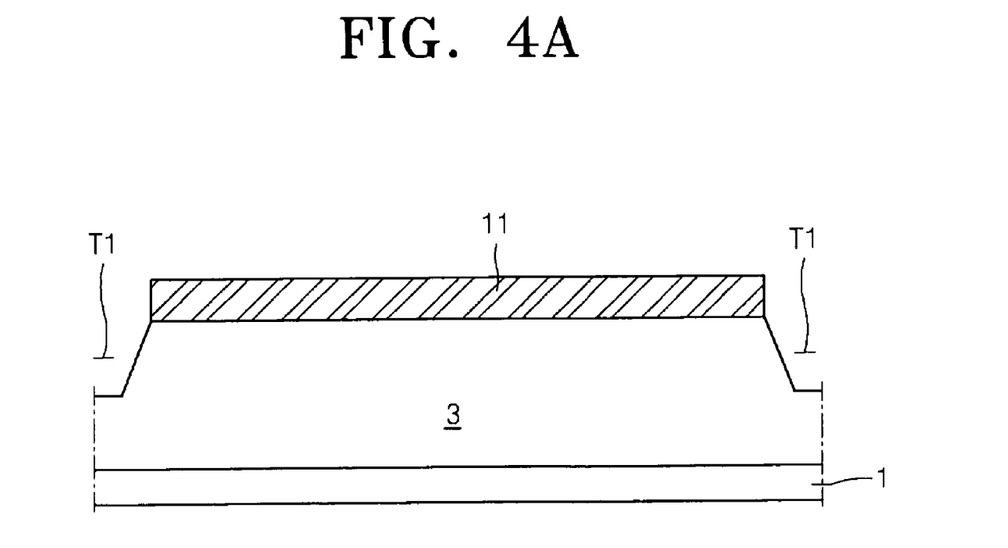
FIGS. 4A, 4B, and 4C are cross-sectional views illustrating the method of manufacturing the high-voltage transistor according to example embodiments, the views being taken along line II-II' for respective processes.
Figure 4B:
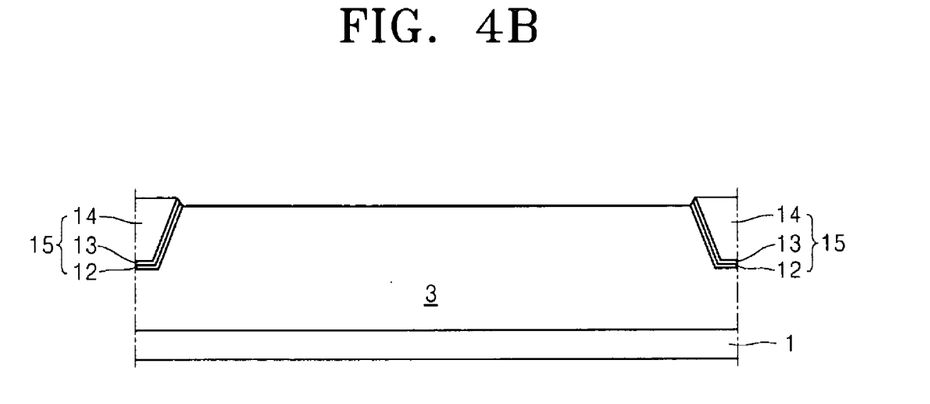
Figure 4C:
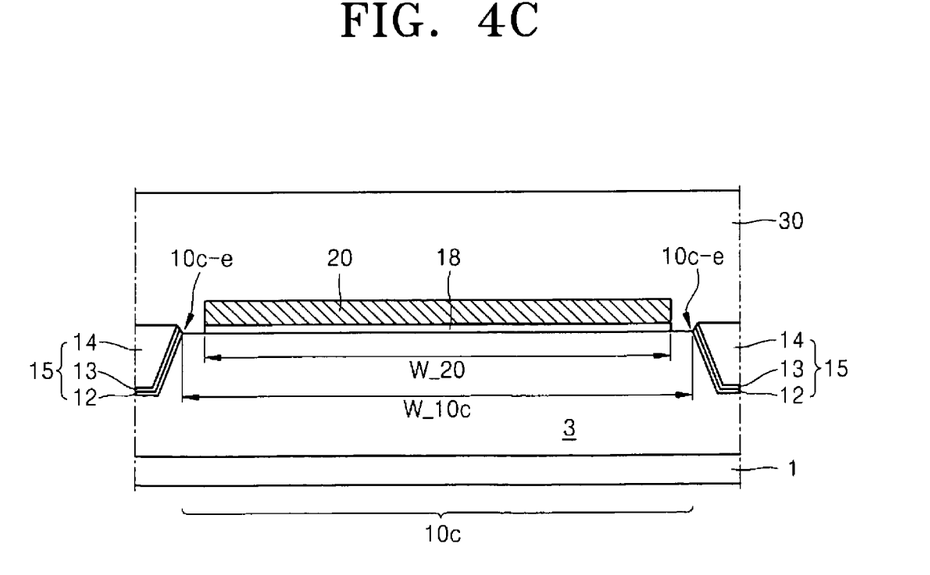

FIGS. 3A, 3B, 3C, 4A, 4B, and 4C are cross-sectional views describing a method of manufacturing the high-voltage transistor according to example embodiments. Particularly, FIGS. 3A, 3B, and 3C are cross-sectional views taken along line I-I' for respective processes. FIGS. 4A, 4B, and 4C are cross-sectional views taken along line II-II' for respective processes. Referring to FIGS. 3A and 4A, the well 3 may have a first conductivity type formed in the substrate 1 by doping impurities. For example, the well 3 may be formed by boron, a p-type dopant. A proper dose of the boron may be about $5 \times 10^{11} \sim 5 \times 10^{13}$ ions/cm². A hard mask pattern 11 may be formed on the substrate 1, and the substrate 1 may be etched using the hard mask pattern 11 as a mask to form first and second trenches T1 and T2. The hard mask pattern 11 may have a structure having an oxide layer and a nitride layer that are sequentially stacked.

Referring to FIGS. 3B and 4B, the oxide layer liner 12 may be formed on sidewalls and bottoms of the trenches T1 and T2 by heat-oxidizing inner surfaces of the trenches T1 and T2. In example embodiments, the dopant (e.g., boron), which may be doped in the well 3, may be pumped into the oxide layer liner 12. This may induce dopant segregation that may reduce the well-doping concentration at portions of the well 3 that are adjacent to the trenches T1 and T2.

The nitride layer liner 13 may be formed on the oxide layer liner 12. The buried dielectric 14 may be formed on the nitride layer liner 13 and planarized. The hard mask pattern 11 may be removed to form the isolation layer 15 in the first trench T1, and the drain field dielectric 19d may be formed in the second trench T2. The buried dielectric 14 may be a high-density plasma oxide layer that may have an improved gap-fill property.

The device active region 10 may be defined by the isolation layer 15. The drain field dielectric 19d may be formed through a process that is the same as the process for forming the isolation layer 15. However, the drain field dielectric 19d may not serve to define the device active region 10 but may be included in the device active region 10. In addition, the drain field dielectric 19d may be formed through a process that is different from the process for forming the isolation layer 15. The drain field dielectric 19d may be formed through a LOCOS process.

The source and drain drift regions 5L and 7L may have a second conductivity type, opposite to the first conductivity type, and may be formed by doping impurities in a portion of the device active region 10. For example, the source and drain drift regions 5L and 7L may be formed by doping phosphorous (P), an n-type dopant. A proper dose of the phosphorous may be about $5 \times 10^{11} \sim 5 \times 10^{13}$ ions/cm². A region of the device active region 10, where the source drift region 5L is formed, may be defined as the source active region 10s, and a region of the device active region 10, where the drain drift region 7L is formed, may be defined as the drain active region 10d. In example embodiments, a region between the source and drain drift regions 5L and 7L in the device active region 10 may be defined as the channel active region 10c. The channel active region 10c may have the pair of edges 10c_e, facing each other and contacting the device isolation layer 15. The source and drain drift regions 5L and 7L may extend to the lower portion of the isolation layer 15, which may be adjacent to the device active region 10. The drain drift region 7L may be formed to cover lower portions of both sides of the drain field dielectric 19d.

Referring to FIGS. 3C and 4C, the gate dielectric 18 and the gate conductive layer (not shown) may be formed on the substrate 1. The gate dielectric 18 may be a silicon oxide layer, a lanthanum oxide layer, an aluminum oxide layer, a zirconium oxide layer, or a hafnium oxide layer. The gate conductive layer may be a polysilicon layer, a titanium nitride layer, a tungsten layer, a tungsten nitride layer, or a tantalum nitride layer.

The gate electrode 20 may be formed by patterning the gate dielectric 18 and the gate conductive layer. Thus, the gate electrode 20 may overlap the channel active region 10c, and the gate dielectric 18 may be disposed between the channel active region 10c and the gate electrode 20. The gate electrode 20 may extend to the drain active region 10d. For example, the gate electrode 20 may extend to the drain drift region 7L. In example embodiments, the drain field dielectric 19*d* may be located between the gate electrode 20 and the drain drift region 7L.

The edges 10*c*_*e* of the channel active region 10*c* may be exposed around the gate electrode 20. Accordingly, the gate electrode 20 may be configured such that the width W_20 thereof is less than the width W_10*c* of the channel active region 10*c*. As a result, the edges 10*c*_*e* of the channel active region 10*c* may not be affected by the voltage applied to the gate electrode 20. Therefore, channels may not be formed in the edges 10*c*_*e*, and thus, the hump may not be induced in the Id-Vg curve.

The source and drain impurity regions 5H and 7H may be formed in the source and drain active regions 10*s* and 10*d* that may be exposed beyond the periphery of the gate electrode 20. The source and drain impurity regions 5H and 7H may be formed within the source and drain drift regions 5L and 7L, respectively. Like the source and drain drift regions 5L and 7L, the source and drain impurity regions 5H and 7H may have the second conductivity type but have a higher impurity concentration than the source and drain drift regions 5L and 7L. The proper dose of the phosphorous doped in the source and drain impurity regions 5H and 7H may be about $1 \times 10^{15} \sim 2 \times 10^{16}$ ions/cm$^2$ The interlayer dielectric 30 may be formed on the substrate 1. The gate contact hole 30*c*, for partly exposing the gate electrode 20, the source contact hole 30*s*, for partly exposing the source impurity region 5H, and the drain contact hole 30*d*, for partly exposing the drain impurity region 7H, may be formed in the interlayer dielectric 30. The gate contact hole 30*c* may overlap the drain field dielectric 19*d*. The drain field dielectric 19*d* may be thicker than the gate dielectric 18, and thus, the drain field dielectric 19*d* may not experience the dielectric breakdown by plasma that is used in an etching process to form the gate contact hole 30*c*.

A metal line conductive layer may be formed on the interlayer dielectric 30, and the metal line conductive layer may be patterned to form the gate, source, and drain lines 40*c*, 40*s*, and 40*d* in the gate, source, and drain contact holes 30*c*, 30*s*, and 30*d*, as shown in FIG. 2A.

Figure 5:
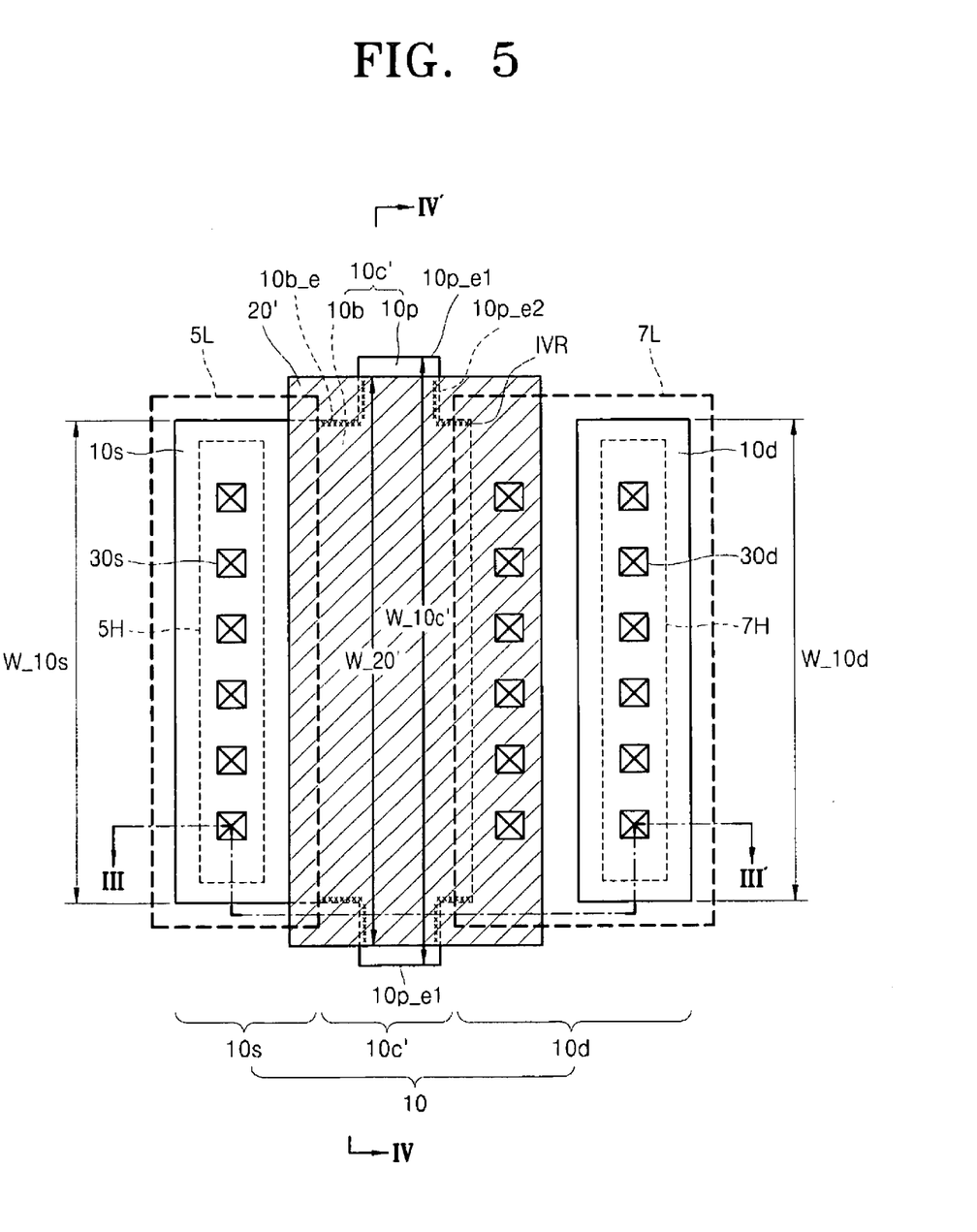
FIG. 5 is a schematic plan view of a high-voltage transistor according to example embodiments.
Figure 6:
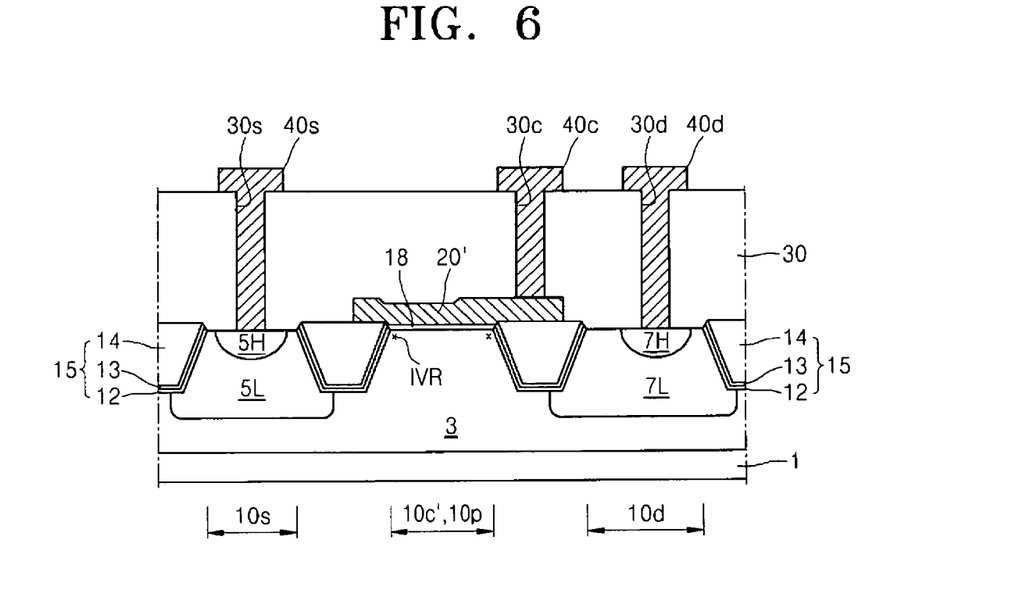
FIG. 6 is a cross-sectional view taken along line III-III' of FIG. 5.
Figure 7:
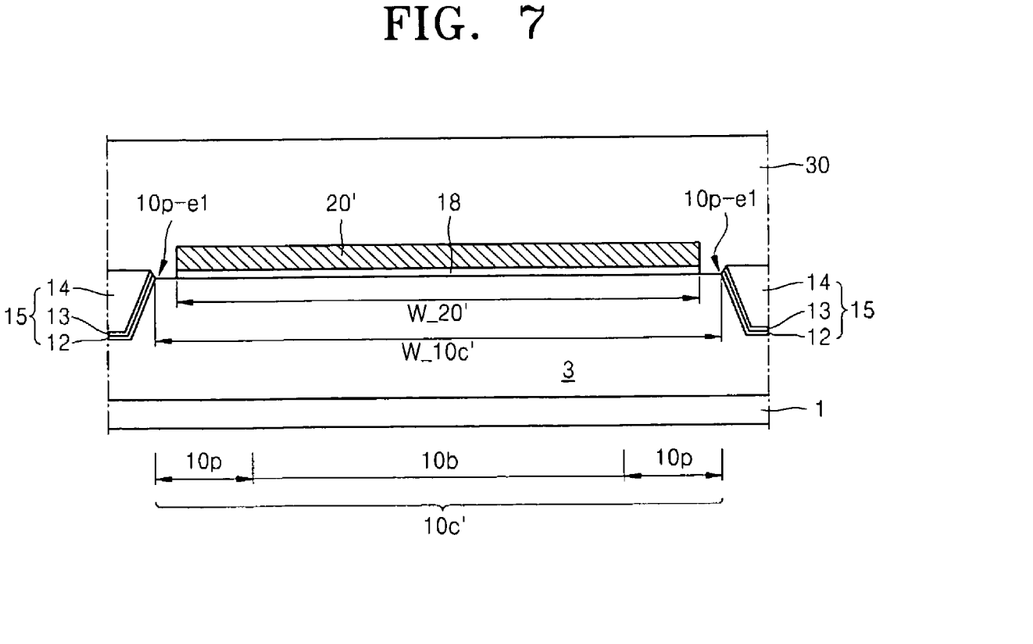
FIG. 7 is a cross-sectional view taken along IV-IV' of FIG. 5.

FIG. 5 is a schematic plan view of a high-voltage transistor according to example embodiments. FIG. 6 is a cross-sectional view taken along line III-III' of FIG. 5 and FIG. 7 is a cross-sectional view taken along IV-IV' of FIG. 5. The high-voltage transistor of example embodiments illustrated in FIGS. 5, 6, and 7 may be substantially identical to the high-voltage transistor described with reference to FIGS. 1, 2A, and 2B except for the following.

Referring to FIGS. 5, 6, and 7, a channel active region 10*c*' may include a body region 10*b* having the same width as the source and drain active regions 10*s* and 10*d* and a pair of extending active regions 10*p* protruding from the body region 10*b*. Each of the extending active regions 10*p* may include first and second edges 10*p*_*e*1 and 10*p*_*e*2 contacting the isolation layer 15. In addition, the body region 10*b* may include a third edge 10*b*_*e* contacting the isolation layer 15. The first edge 10*p*_*e*1 may be located at an opposite side to the body region 10*b*. Each of the second edges 10*p*_*e*2 may be located near the source active region 10*s* or the drain active region 10*d* so as to interconnect the first and third edges 10*p*_*e*1 and 10*b*_*e*. A width W_10*c*' of the channel active region 10*c*' may be greater than widths W_10*s* and W_10*d* of the source and drain active regions 10*s* and 10*d*. The width W_10*c*' of the channel active region 10*c*' may be defined as a distance between the first edges 10*p*_*e*1 provided on the respective extending active regions 10*p*.

A gate electrode 20' may overlap the channel active region 10*c*' and may be disposed on the active region 10. A width W_20' of the gate electrode 20' may be less than the width W_10*c*' of the channel active region 10*c*', and therefore, the edges of the channel active region 10*c*' may be exposed beyond the periphery of the gate electrode 20'. Furthermore, the width W_20' of the gate electrode 20' may be greater than the widths W_10*s* and W_10*d* of the source and drain active regions 10*s* and 10*d*. In example embodiments, the gate electrode 20' may overlap the body region 10*b* and the extending active regions 10*p*. In addition, edges of the channel active region 10*c*' that may be exposed beyond the periphery of the gate electrode 20' may be the first edges 10*p*_*e*1 of the extending active regions 10*p*. A distance between the gate electrode 20' and the edges 10*p*_*e*1 may be about 0.1-1 μm.

The gate electrode 20' may overlap the body region 10*b* and the extending active regions 10*p*. The gate electrode 20' may also overlap the third edges 10*b*_*e* and the second edges 10*p*_*e*2. The first, second, and third edges 10*p*_*e*1, 10*p*_*e*2 and 10*b*_*e* may have a relatively low doping concentration due to a dopant segregation. A voltage equal to or less than a threshold voltage may be applied to the gate electrode 20' and the second and third edges 10*p*_*e*2 and 10*b*_*e* may be inversed (IVR) because the second and third edges 10*p*_*e*2 and 10*b*_*e* may be affected by the voltage applied to the gate electrode 20'. In FIG. 5, IVR denotes an inversion region associated with the symbols "x" near, for example, 10*p*_*e*2, 10*b*_*e*. However, the first edges 10*p*_*e*1 may not be affected by the voltage that is applied to the gate electrode 20' and thus the first edges 10*p*_*e*1 may not be inversed. Therefore, channels that may electrically connect the source and drain active regions 10*s* and 10*d*, for example, the source and drain drift regions 5L and 7L, may not be formed in the first, second, and third edges 10*p*_*e*1, 10*p*_*e*2 and 10*b*_*e*. Therefore, a hump may not be induced and thus a leakage current below the threshold voltage may be reduced or prevented.

The isolation layer 15 may have an STI structure having the nitride layer liner 12. Because a channel may not be formed in the first, second, and third edges 10*p*_*e*1, 10*p*_*e*2 and 10*b*_*e*, the trapping of the electric charges in the nitride layer liner 12 adjacent to the first, second, and third edges 10*p*_*e*1, 10*p*_*e*2 and 10*b*_*e* may be prevented or reduced. Therefore, the deterioration of the high-voltage transistor may be prevented or reduced.

Figure 8:
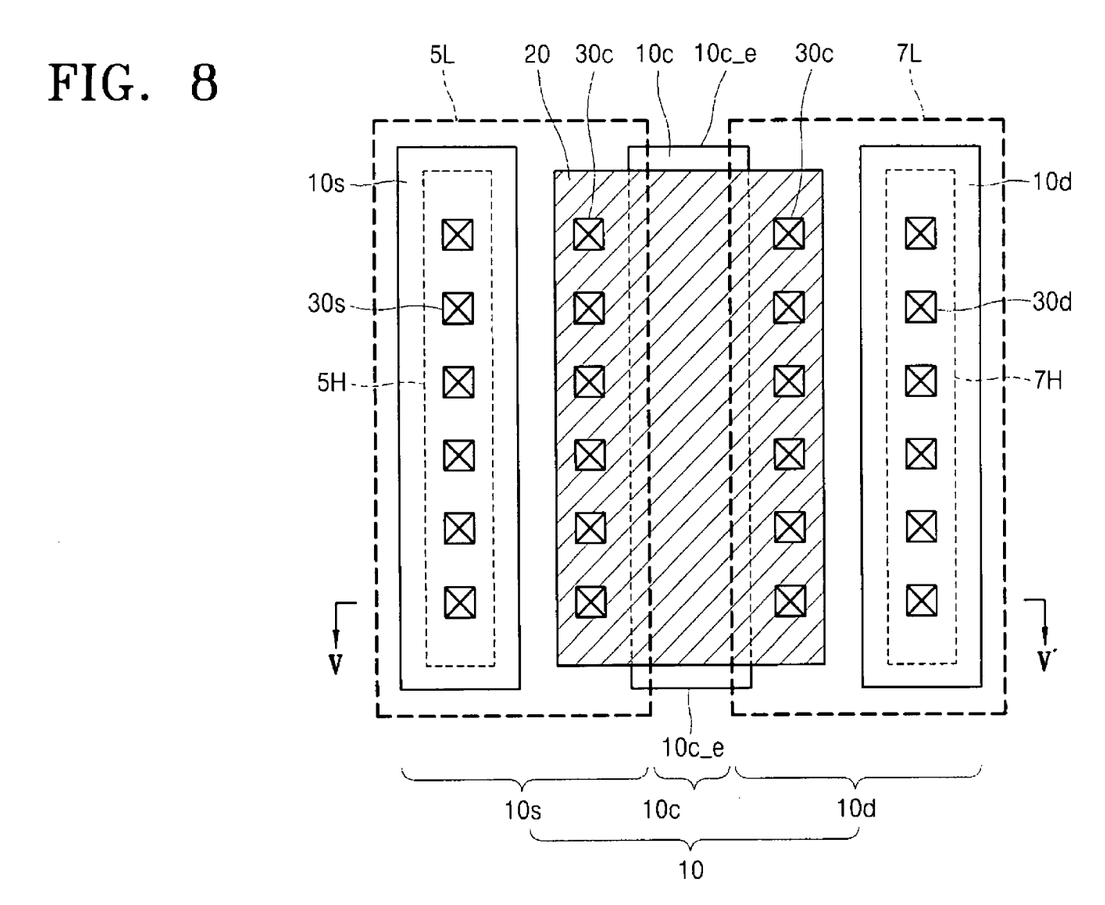
FIG. 8 is a cross-schematic plan view of a high-voltage transistor according to example embodiments.
Figure 9:
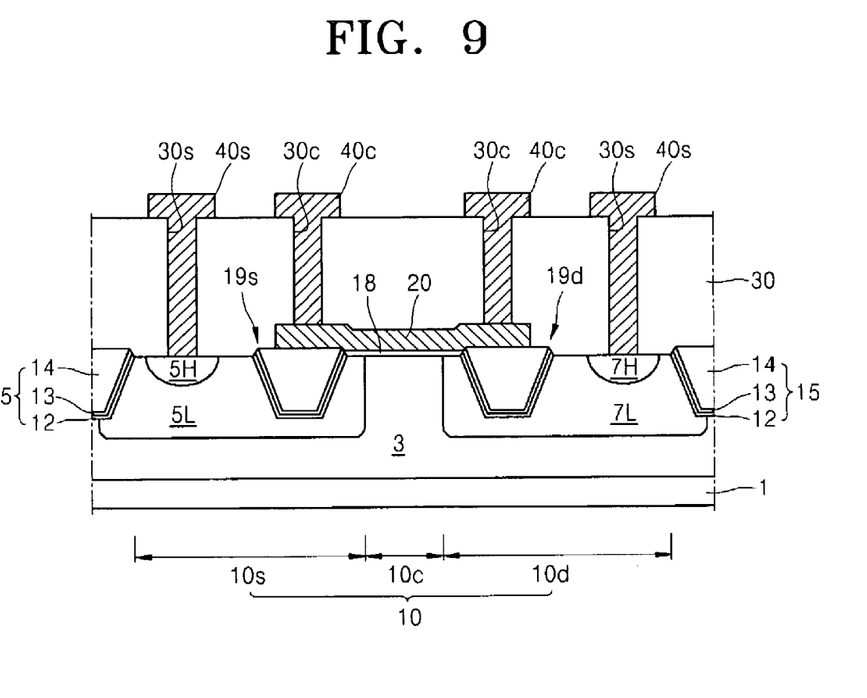
FIG. 9 is a cross-sectional view taken along line V-V' of FIG. 8.

FIG. 8 is a schematic plan view of a high-voltage transistor according to example embodiments. FIG. 9 is a cross-sectional view taken along line V-V' of FIG. 8. The high-voltage transistor of example embodiments illustrated in FIGS. 8 and 9 is substantially identical to the high-voltage transistor described with reference to FIGS. 1, 2A, and 2B except for the following. Referring to FIGS. 8 and 9, a drain field dielectric 19*d* may be located between a gate electrode 20 and a drain drift region 7L, and a source field dielectric 19*s* may be located between the gate electrode 20 and a source drift region 5L. In example embodiments, the electric fields between the gate electrode 20 and the drain drift region 7L and between the gate electrode 20 and the source drift region 5L may be reduced, and thus, breakdown voltages between the gate electrode 20 and the drain drift region 7L and between the gate electrode 20 and the source drift region 5L may be increased.

Gate contact holes 30*c* may be formed in an interlayer dielectric 30 to partly expose the gate electrode 20. The gate contact holes 30*c* may overlap the drain field dielectric 19*d* or the source field dielectric 19*s*. Because the drain field dielectric 19*d* and the source field dielectric 19*s* may be thicker than the gate dielectric 18, the drain field dielectric 19*d* and the source field dielectric 19s may not experience a dielectric breakdown. Because the high-voltage transistor illustrated in FIGS. 8 and 9 has a source and drain that are symmetric, the high-voltage transistor may be used as a bi-directional device.

Figure 10:
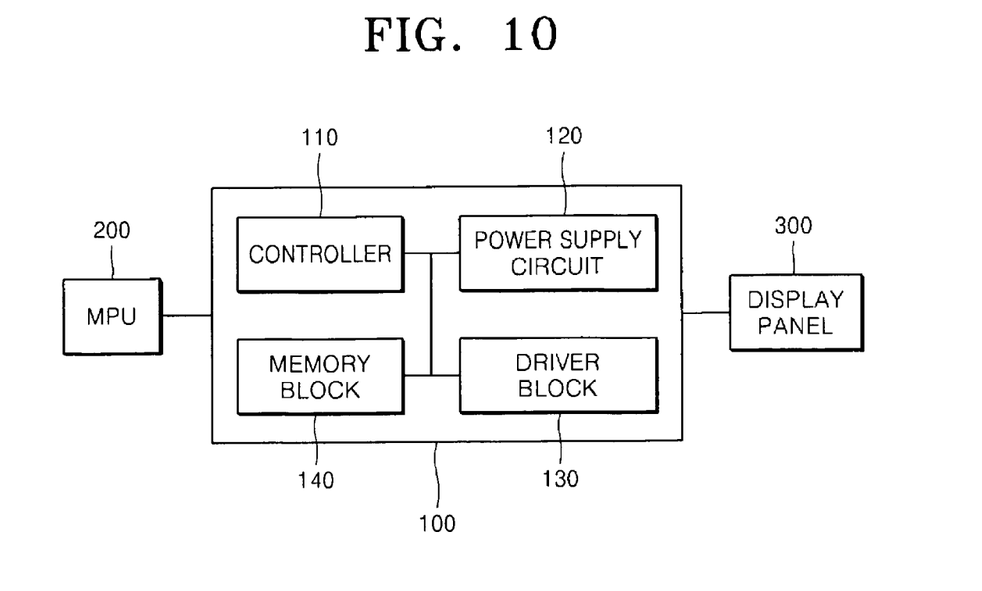
FIG. 10 is a schematic block diagram of a display driver integrated circuit (DDI) and a display panel having the DDI, according to example embodiments.

FIG. 10 is a schematic block diagram of a display driver integrated circuit (DDI) 100 and a display panel 300 having the DDI, according to example embodiments. Referring to FIG. 10, a DDI 100 may include a controller 110, a power supply circuit 120, a driver block 130, and a memory block 140. The controller 110 may receive signals from a main processing unit (MPU) and may decode the signals so as to control the blocks of the DDI 100, and may realize an operation in response to the signals. The power supply circuit 120 may generate a driving voltage in response to a signal generated by the controller 110. The driver block 130 may drive a display panel 300 using the driving voltage generated by the power supply circuit 120 in response to the signal generated by the controller 110. The display panel 300 may be a liquid crystal display panel or a plasma display panel. The memory block 140 may be a RAM and/or ROM for temporarily storing control signals input to or output from the control unit 110 and may require data. The power circuit 120 and the driver block 130 may include one of the high-voltage transistors of the above-described embodiments. Other blocks may include a low-voltage transistor operating by a voltage lower than one used to operate the high-voltage transistor.

According to example embodiments, because a channel active region includes the edges contacting an isolation layer and a gate electrode that may not be located on the edges, the edges may not be affected by the voltage that is applied to the gate electrode. Therefore, a channel may not be formed in the edges. As a result, a hump may not be induced in the Id-Vg curve and the leakage current at a voltage equal to or less than the threshold voltage may be reduced or prevented. In addition, even when the isolation layer has a nitride layer liner, the trapping of the electric charges in the nitride layer liner adjacent to the edges may be prevented or reduced, and thus, a deterioration of a transistor may be prevented or reduced.

Because a drain drift region covering a drain impurity region may be provided within drain active regions, the junction breakdown voltage may be increased. In addition, because a drain field dielectric thicker than a gate dielectric may be provided between the gate electrode and the drain drift region, a breakdown voltage between the gate electrode and the drain drift region may be increased. As a result, the transistor may reliably operate even with an increased operation voltage. Because the gate contact hole may be formed above the gate electrode and may overlap the drain field dielectric, the drain field dielectric may not experience a dielectric breakdown during a process for forming the gate contact hole.

While example embodiments have been particularly shown and described with reference to example embodiments thereof, it will be understood by those of ordinary skill in the art that various changes in form and details may be made therein without departing from the spirit and scope of the following claims.

What is claimed is:

1. A transistor comprising:
   a substrate with a device active region defined by an isolation layer, wherein the device active region includes a source active region, a channel active region, and a drain active region, and the channel active region includes a pair of edges contacting the isolation layer;
   a gate electrode overlapping the channel active region, wherein the pair of edges of the channel active region are exposed beyond a periphery of the gate electrode in a channel width direction;
   a gate dielectric between the gate electrode and the channel active region; and
   source and drain impurity regions within the source and drain active regions, wherein a channel length direction is a direction from the source active region to the drain active region and the channel width direction is a direction perpendicular to the channel length direction.

2. The transistor of claim 1, further comprising:
   a drain drift region in the drain active region and surrounding the drain impurity region.

3. The transistor of claim 1, further comprising:
   a source drift region within the source active region and surrounding the source impurity region.

4. The transistor of claim 3, wherein the gate electrode overlaps the source drift region and a source field dielectric thicker than the gate dielectric is between the gate electrode and the source drift region.

5. The transistor of claim 1, wherein a width of the channel active region is the same as those of the source and drain active regions.

6. The transistor of claim 1, wherein the channel active region comprises a body region having the same width as the source and drain active regions and a pair of extending active regions on the sides of the body region.

7. The transistor of claim 6, wherein the gate electrode overlaps the body region and the extending active regions.

8. The transistor of claim 7, wherein each of the extending active regions includes a pair of edges extending from the body region and contacting the isolation layer and each of the pair of edges of the extending active regions includes a first portion which is in contact with the gate electrode and a second portion exposed beyond the periphery of the gate electrode.

9. The transistor of claim 8, wherein each of the extending active regions is located at an opposite side of the body region.

10. A display driver integrated circuit comprising:
    a controller configured to generate at least one signal;
    a power supply circuit configured to generate a driving voltage in response to the at least one signal; and
    a driver block configured to use the driving voltage from the power supply circuit to drive a peripheral device,
    wherein each of the power supply circuit and the driver block comprises a transistor claimed in claim 1.

11. The transistor of claim 1, wherein a width of the gate electrode in the channel width direction is less than a width of the channel active region in the channel width direction.

12. A transistor comprising:
    a substrate with a device active region defined by an isolation layer, wherein the device active region includes a source active region, a channel active region, and a drain active region, and the channel active region includes a pair of edges contacting the isolation layer;
    a gate electrode overlapping the channel active region, wherein the edges are exposed beyond a periphery of the gate electrode;
    a gate dielectric between the gate electrode and the channel active region;
    source and drain impurity regions within the source and drain active regions; and
    a drain drift region in the drain active region and surrounding the drain impurity region, wherein the gate electrode overlaps the drain drift region, and a drain field dielectric thicker than the gate dielectric is between the gate electrode and the drain drift region.

13. The transistor of claim 12, wherein the drain field dielectric has the same structure as the isolation layer.

14. The transistor of claim 12, wherein a contact hole is located above the gate electrode and the drain field dielectric.

15. A transistor comprising:
- a substrate with a device active region defined by an isolation layer, wherein the device active region includes a source active region, a channel active region, and a drain active region, and the channel active region includes a pair of edges contacting the isolation layer;
- a gate electrode overlapping the channel active region, wherein the edges are exposed beyond a periphery of the gate electrode;
- a gate dielectric between the gate electrode and the channel active region;
- source and drain impurity regions within the source and drain active regions; and
- a drain drift region covering the drain impurity region, wherein the gate electrode extends to the drain drift region; and
- a drain field dielectric between the gate electrode and the drain drift region, wherein the drain field dielectric is thicker than the gate dielectric.

16. The transistor of claim 15, further comprising:
- a source drift region within the source active region and covering the source impurity region, wherein the gate electrode extends to the source drift regions; and
- a source field dielectric between the gate electrode and the source drift region, wherein the source field dielectric is thicker than the thickness of the gate dielectric.

17. The transistor of claim 15, wherein the channel active region has the same width as the source and drain active regions.

18. The transistor of claim 15, wherein:
- the channel active region includes a body region having the same width as the source and drain active regions and a pair of extending active regions on the sides of the body region;
- the gate electrode overlaps the body region and the extending active regions;
- the edges exposed beyond the periphery of the gate electrode are edges of the extending active regions; and
- each of the edges is located on an opposite side of the body region.

19. The transistor of claim 15, wherein a contact hole is above the gate electrode and the drain field dielectric.

20. The transistor of claim 15, wherein a width of the gate electrode is less than a width of the channel active region.

* * * * *